United States Patent
Kwak et al.

(10) Patent No.: US 10,930,835 B2
(45) Date of Patent: Feb. 23, 2021

(54) THERMOELECTRIC MODULE SHEET AND THERMOELECTRIC MODULE ASSEMBLY INCLUDING THE SAME

(71) Applicants: Hyundai Motor Company, Seoul (KR); Kia Motors Corporation, Seoul (KR)

(72) Inventors: Jin Woo Kwak, Gyeongsangbuk-do (KR); Byung Wook Kim, Gyeonggi-do (KR); Su Jung Noh, Seoul (KR); Hoo Dam Lee, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/957,592

(22) Filed: Apr. 19, 2018

(65) Prior Publication Data
US 2019/0165235 A1    May 30, 2019

(30) Foreign Application Priority Data
Nov. 29, 2017    (KR) .................. 10-2017-0162139

(51) Int. Cl.
*H01L 35/32* (2006.01)
*H01L 35/30* (2006.01)
*H01L 35/02* (2006.01)

(52) U.S. Cl.
CPC .............. *H01L 35/32* (2013.01); *H01L 35/02* (2013.01); *H01L 35/30* (2013.01)

(58) Field of Classification Search
None
See application file for complete search history.

(56) References Cited

U.S. PATENT DOCUMENTS

| | | | |
|---|---|---|---|
| 10,505,093 B2 * | 12/2019 | Kim ...................... | H05K 5/0021 |
| 2003/0140957 A1 * | 7/2003 | Akiba ..................... | H01L 35/30 |
| | | | 136/224 |
| 2011/0214707 A1 * | 9/2011 | Suzuki .................... | H01L 35/30 |
| | | | 136/205 |
| 2016/0247995 A1 * | 8/2016 | Gouko .................... | H01L 35/22 |

FOREIGN PATENT DOCUMENTS

KR        101493792 B1    2/2015

OTHER PUBLICATIONS

Nishino et al., "Flexible thermoelectric generator with efficient vertical to lateral heat path films"; Feb. 2017, Journal of Micromechanics and Microengineering, 27, 035011, (8pp) (Year: 2017).*

* cited by examiner

*Primary Examiner* — Tamir Ayad
(74) *Attorney, Agent, or Firm* — Mintz Levin Cohn Ferris Glovsky and Popeo, P.C.; Peter F. Corless

(57) ABSTRACT

The present disclosure relates to a thermoelectric module sheet that includes a base substrate, a plurality of thermoelectric elements laminated on a surface of the base substrate, and a plurality of electrodes, each of which is laminated on at least one surface of at least one of the plurality of thermoelectric elements to electrically connect the plurality of thermoelectric elements by a predetermined connecting method.

10 Claims, 16 Drawing Sheets

THERMOELECTRIC MODULE SHEET AND THERMOELECTRIC MODULE ASSEMBLY INCLUDING THE SAME

CROSS-REFERENCE TO RELATED APPLICATION

This application is based on and claims the benefit of priority to Korean Patent Application No. 10-2017-0162139, filed on Nov. 29, 2017 in the Korean Intellectual Property Office, the disclosure of which is incorporated herein in its entirety by reference.

TECHNICAL FIELD

The present disclosure relates generally to thermoelectric modules and, more particularly, to a thermoelectric module sheet and a thermoelectric module assembly including the same.

BACKGROUND

Recently, thermoelectric modules have been used for recovering waste heat discharged from apparatuses, such as vehicles, using the Seebeck effect of generating an electromotive force with a temperature difference between opposite ends of a thermoelectric element. Conventional thermoelectric modules include N-type and P-type thermoelectric elements having opposite polarities and arranged alternately, electrodes for electrically connecting the thermoelectric elements, and insulation substrates for insulating the electrodes.

Conventional thermoelectric modules may be manufactured by forming first electrodes on an upper surface of a lower insulation substrate, bonding one surface of each thermoelectric element manufactured in advance to the corresponding first electrode using a bonding agent, and bonding each second electrode formed in advance on an upper insulation substrate to an opposite surface of each thermoelectric element, which is opposite to the one surface of the thermoelectric element, using a bonding agent. The thermoelectric elements are bonded to the first electrodes after being separately aligned with the first electrodes. Due to this, conventional thermoelectric modules face a problem in that productivity is degraded.

Furthermore, the thermoelectric elements must be separated from one another by a predetermined distance to prevent short-circuits between the thermoelectric elements. Due to this, the thermoelectric modules face an additional problem in that the thermoelectric elements are vulnerable to a mechanical vibration environment and are likely to be damaged when the thermoelectric module is press-fit into an apparatus for recovering waste heat. Therefore, the density of the thermoelectric elements is low. In addition, since the electrodes and the thermoelectric elements are laminated on the insulation substrates formed of rigid materials, like ceramic, the shape of the thermoelectric module is limited during manufacturing.

SUMMARY

The present disclosure has been made to solve the above-mentioned problems occurring in the related art while advantages achieved by the related art are maintained intact.

An aspect of the present disclosure provides a thermoelectric module sheet having an improved structure for collectively forming and arranging a plurality of thermoelectric elements, and a thermoelectric module assembly including the thermoelectric module sheet.

Furthermore, another aspect of the present disclosure provides a thermoelectric module sheet having an improved structure that is robust to a mechanical vibration environment and is capable of reducing the risk of damage, and a thermoelectric module assembly including the thermoelectric module sheet.

Moreover, another aspect of the present disclosure provides a thermoelectric module sheet having an improved structure for increasing the density of thermoelectric elements, and a thermoelectric module assembly including the thermoelectric module sheet.

In addition, another aspect of the present disclosure provides a thermoelectric module sheet having an improved structure for easily implementing thermoelectric modules having various shapes, and a thermoelectric module assembly including the thermoelectric module sheet.

The technical problems to be solved by the present disclosure are not limited to the aforementioned problems, and any other technical problems not mentioned herein will be clearly understood from the following description by those skilled in the art to which the present disclosure pertains.

According to embodiments of the present disclosure, a thermoelectric module sheet includes: a base substrate, a plurality of thermoelectric elements laminated on a surface of the base substrate, and a plurality of electrodes, each of which is laminated on at least one surface of at least one of the plurality of thermoelectric elements to electrically connect the plurality of thermoelectric elements by a predetermined connecting method.

The plurality of thermoelectric elements may be arranged at a predetermined interval in a width direction of the base substrate.

The base substrate may be formed of an elastically deformable material.

The base substrate may have a sheet shape, and the surface of the base substrate is a sheet surface with a width and a height that are greater than a thickness of the base substrate.

The plurality of thermoelectric elements may be arranged on the sheet surface such that a height direction of the plurality of thermoelectric elements is parallel to a height direction of the base substrate.

The plurality of thermoelectric elements may be arranged on the sheet surface such that: end portions of each thermoelectric element are located on a single straight line together with an end portion of the sheet surface, or the end portions of each thermoelectric element are spaced a predetermined distance apart from the end portion of the sheet surface in a direction toward a central portion of the sheet surface.

At least a portion of each of the plurality of electrodes may be either located on a single straight line together with an end portion of the sheet surface or disposed to protrude beyond the end portion of the sheet surface in a predetermined direction.

The predetermined direction may be a height direction of the plurality of thermoelectric elements.

Each of the plurality of electrodes may include a first part having at least a portion laminated on a heat source-side end surface or a cold source-side end surface of at least one predetermined thermoelectric element, among the plurality of thermoelectric elements, to protrude beyond the end portion of the sheet surface in the predetermined direction.

Each of the plurality of electrodes may further include a second part having at least a portion laminated on another surface of the at least one predetermined thermoelectric element that extends from the heat source-side end surface or the cold source-side end surface.

Furthermore, according to embodiments of the present disclosure, a thermoelectric module assembly includes: a plurality of thermoelectric module sheets stacked in a predetermined stack direction and a plurality of insulation sheets, each of which covers one of the plurality of thermoelectric module sheets. Each of the plurality of thermoelectric module sheets includes a base substrate, a plurality of thermoelectric elements arranged on a surface of the base substrate, and a plurality of electrodes that electrically connect the plurality of thermoelectric elements by a predetermined connecting method.

Each of the plurality of insulation sheets may be installed to cover at least a part of the plurality of thermoelectric elements and a part of the plurality of electrodes of a given thermoelectric module sheet in the stack direction.

The thermoelectric module sheets and the insulation sheets may have a rounded shape.

The thermoelectric module assembly may further include a housing in which the plurality of thermoelectric module sheets and the plurality of insulation sheets are accommodated, and the housing may have at least one opening through which at least a part of the plurality of thermoelectric module sheets is exposed to the outside.

The thermoelectric module assembly may further include an insulation layer stacked on the at least a part of the plurality of thermoelectric module sheets.

At least a portion of each of the plurality of electrodes may either be located on a single straight line together with an end portion of the one surface of the base substrate or disposed to protrude beyond the end portion of the surface of the base substrate in a predetermined direction, at least a part of the plurality of thermoelectric module sheets including the at least a portion of each of the plurality of electrodes.

Furthermore, according to embodiments of the present disclosure, a thermoelectric module assembly includes: at least one thermoelectric module sheet and at least one insulation sheet stacked on the at least one thermoelectric module sheet. The at least one thermoelectric module sheet includes a base substrate folded to have a multi-layer structure, a plurality of thermoelectric elements arranged on a surface of the base substrate, and a plurality of electrodes that electrically connect the thermoelectric elements by a predetermined connecting method. The at least one insulation sheet is interposed between one layer of the base substrate and another layer of the base substrate.

The thermoelectric module assembly may further include a housing in which the at least one thermoelectric module sheet and the at least one insulation sheet are accommodated, and the housing may have at least one opening through which at least a part of the at least one thermoelectric module sheet is exposed to the outside.

The thermoelectric module assembly may further include an insulation layer stacked on the at least a part of the at least one thermoelectric module sheet.

At least a portion of each of the plurality of electrodes may either be located on a single straight line together with an end portion of the one surface of the base substrate or disposed to protrude beyond the end portion of the one surface of the base substrate in a predetermined direction, the at least a part of the at least one thermoelectric module sheet including the at least a portion of each of the plurality of electrodes.

Accordingly, the present disclosure relates to a thermoelectric module sheet and a thermoelectric module assembly including the same that have at least the following effects:

First, by stacking, rolling, and folding thermoelectric module sheets, it is possible to implement thermoelectric module sheets having various shapes and thermoelectric module assemblies including the same depending on environmental conditions.

Second, by painting thermoelectric elements on a base substrate, it is possible to simultaneously perform a process of manufacturing and arranging the thermoelectric elements, thereby minimizing time required to manufacture and arrange the thermoelectric elements.

Third, by stacking, rolling, and folding a plurality of thermoelectric module sheets and then encapsulating the thermoelectric module sheets in various forms of housings, it is possible to increase the density of thermoelectric elements and implement a thermoelectric module robust to mechanical vibration.

BRIEF DESCRIPTION OF THE DRAWINGS

The above and other objects, features and advantages of the present disclosure will be more apparent from the following detailed description taken in conjunction with the accompanying drawings.

Figure 1:
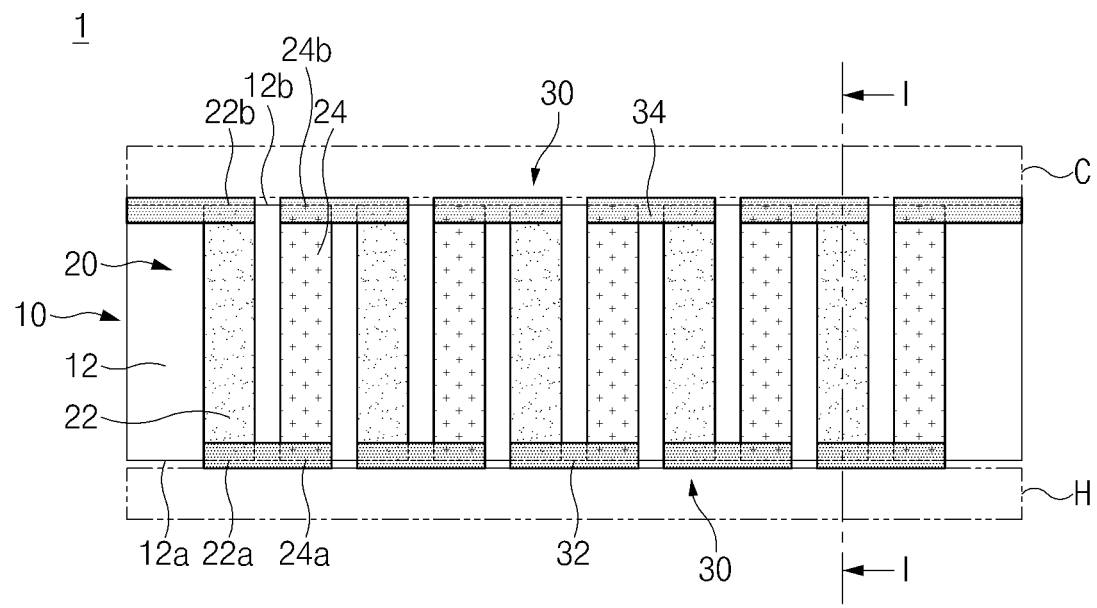
FIG. 1 is a front view of a thermoelectric module sheet according to a first embodiment of the present disclosure.
Figure 1:

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Hereinafter, exemplary embodiments of the present disclosure will be described in detail with reference to the accompanying drawings. In the drawings, the same reference numbers will be used throughout to designate the same or equivalent elements. In addition, a detailed description of well-known features or functions will be ruled out in order not to unnecessarily obscure the gist of the present disclosure.

Terms, such as "first", "second", "A", "B", "(a)", "(b)", and the like, may be used herein to describe elements of the present disclosure. Such terms are only used to distinguish one element from another element, and the substance, sequence, order, or number of these elements is not limited by these terms. Unless otherwise defined, all terms used herein, including technical and scientific terms, have the same meaning as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 2:
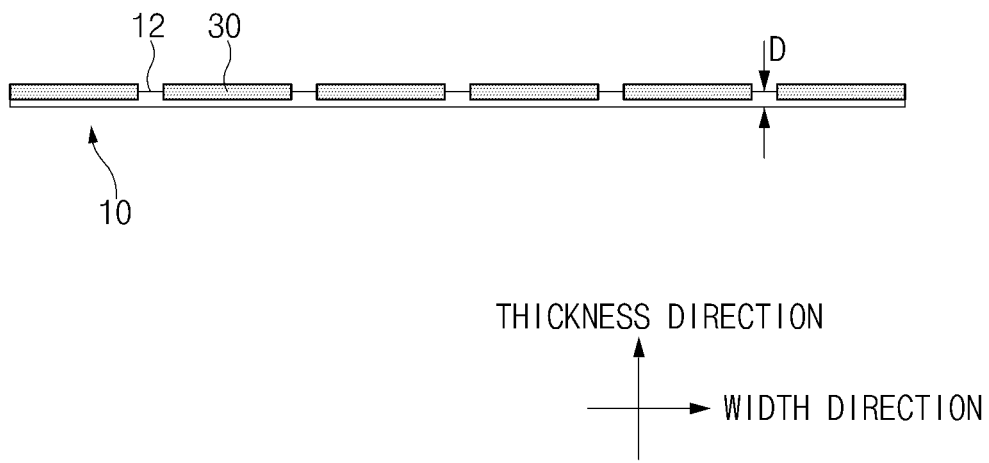
FIG. 2 is a plan view of the thermoelectric module sheet.

Referring now to the presently disclosed embodiments, FIG. 1 is a front view of a thermoelectric module sheet according to a first embodiment of the present disclosure. FIG. 2 is a plan view of the thermoelectric module sheet. The height direction illustrated in FIG. 1 may refer to the height direction of a base substrate 10, the width direction illustrated in FIGS. 1 and 2 may refer to the width direction of the base substrate 10, and the thickness direction illustrated in FIG. 2 may refer to the thickness direction of the base substrate 10.

Referring first to FIG. 1, a thermoelectric module sheet 1 according to the first embodiment of the present disclosure may include the base substrate 10, a plurality of thermoelectric elements 20 arranged on one surface of the base substrate 10, and a plurality of electrodes 30, each of which is disposed on at least one surface of at least one of the plurality of thermoelectric elements 20 to electrically connect the thermoelectric elements 20 by a predetermined connecting method.

Figure 3:
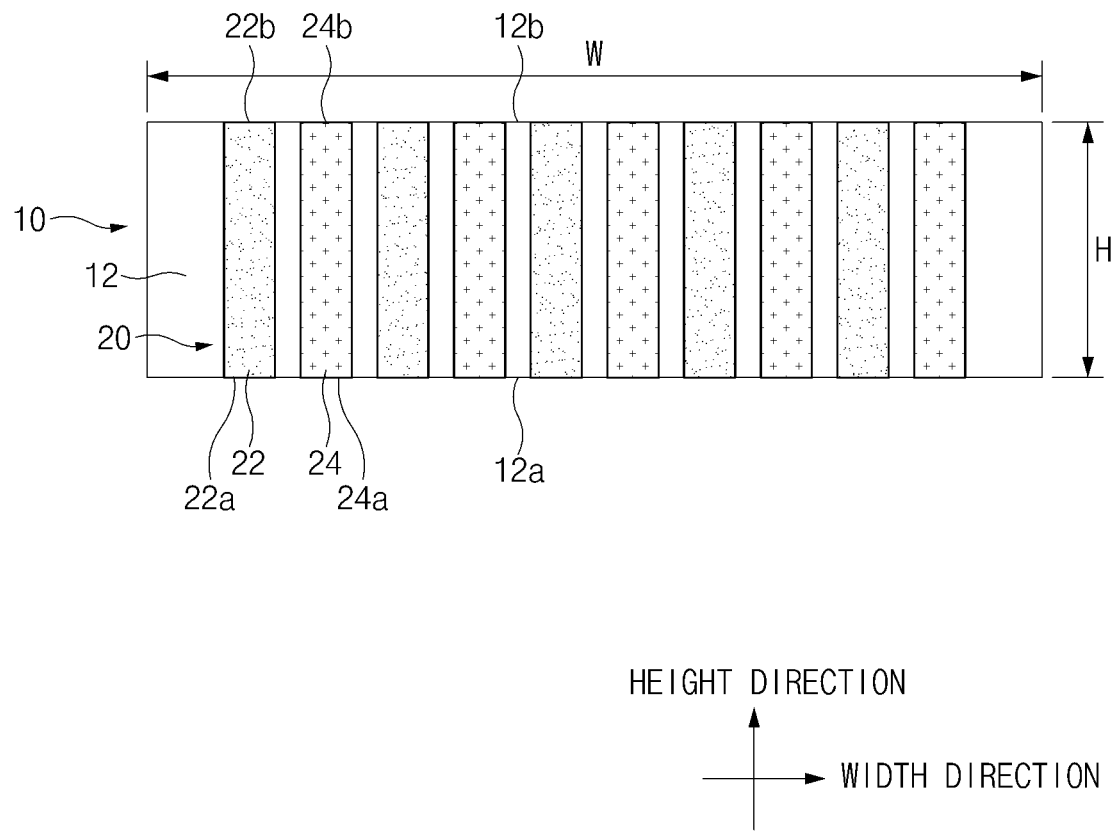
FIG. 3 is a front view illustrating a state in which thermoelectric elements are formed on a base substrate.

As illustrated in FIGS. 2 and 3, the base substrate 10 may have a sheet shape with a width W and a height H that are significantly greater than a thickness D. The base substrate 10 may include sheet surfaces 12 and thickness surfaces 14 and 16. The sheet surfaces 12 may correspond to the front and rear surfaces of the base substrate 10 and may have the predetermined width W and height H. The thickness surfaces 14 and 16 may correspond to the upper-side, lower-side, left-side, and right-side surfaces of the base substrate 10 and may have the predetermined thickness D.

The material of the base substrate 10 is not limited to a specific material, whereby the base substrate 10 may be formed of a material corresponding to the temperature and shape of an apparatus in which the thermoelectric module sheet 1 is mounted. For example, the base substrate 10 may be formed of a flexible material based on an elastically-deformable polymer. Then, the base substrate 10 may be easily folded and rolled according to the shape of the apparatus in which the thermoelectric module sheet 1 is mounted and other environmental conditions. In another example, the base substrate 10 may be formed of a ceramic-based high heat-resistant insulating material. Then, the durability of the base substrate 10 may be stably maintained even under a high-temperature atmosphere.

FIG. 3 is a front view illustrating a state in which thermoelectric elements are laminated on a base substrate.

As illustrated in FIG. 3, the thermoelectric elements 20 may be arranged on one surface of the base substrate 10. The thermoelectric elements 20 may include first thermoelectric elements 22 and second thermoelectric elements 24 alternately arranged at a predetermined interval in the width direction of the base substrate 10. The first thermoelectric elements 22 and the second thermoelectric elements 24 may have opposite polarities. For example, if the first thermoelectric elements are N-type thermoelectric elements, the second thermoelectric elements 24 may be P-type thermoelectric elements, and if the first thermoelectric elements 22 are P-type thermoelectric elements, the second thermoelectric elements 24 may be N-type thermoelectric elements.

As illustrated in FIG. 3, the thermoelectric elements 20 may be preferably arranged such that the height direction of the thermoelectric elements 20 is parallel to the height direction of the base substrate 10. Without being limited thereto, however, the thermoelectric elements 20 may be arranged such that the height direction of the thermoelectric elements 20 is inclined at a predetermined angle with respect to the height direction of the base substrate 10.

As illustrated in FIG. 3, the thermoelectric elements 20 may be preferably arranged such that heat source-side end surfaces 22a and 24a are located on the same straight line together with one end 12a of the sheet surface 12 of the base substrate 10 and cold source-side end surfaces 22b and 24b are located on the same straight line together with an opposite end 12b of the sheet surface 12 of the base substrate 10 that is opposite to the one end 12a of the sheet surface 12 of the base substrate 10. Without being limited thereto, however, the thermoelectric elements 20 may also be arranged such that the heat source-side end surfaces 22a and 24b are spaced a predetermined distance apart from the one end 12a of the sheet surface 12 of the base substrate 10 in the direction toward the central portion of the sheet surface 12 of the base substrate 10 and the cold source-side end surfaces 22b and 24b are spaced a predetermined distance apart from the opposite end 12b of the sheet surface 12 of the base substrate 10 in the direction toward the central portion of the sheet surface 12 of the base substrate 10. Here, the heat source-side end surfaces 22a and 24a of the thermoelectric elements 20 may be surfaces of the thermoelectric elements 20 that make thermal contact with a heat source H, and may correspond to heat-absorbing parts of the thermoelectric elements 20 that absorb heat radiating from the heat source H. The cold source-side end surfaces 22b and 24b of the thermoelectric elements 20 may be surfaces of the thermoelectric elements 20 that make thermal contact with a cold source C, and may correspond to heat-radiating parts of the thermoelectric elements 20 that transfer heat absorbed into the thermoelectric elements 20 to the cold source C.

The material of the thermoelectric elements 20 is not limited to a specific material. For example, the thermoelectric elements 20 may be formed of a BiTe, SKD, Si, or HH-based thermoelectric material.

Meanwhile, the method for arranging the thermoelectric elements 20 on the sheet surface 12 of the base substrate 10 is not limited to a single technique. For example, the thermoelectric elements 20 having a thin sheet shape may be laminated on the sheet surface 12 of the base substrate 10 by painting, on the sheet surface 12 of the base substrate 10, a mixture of a sintering aid, an organic conductive binder, or the like and the above-described thermoelectric material and then sintering the mixture through heat treatment. By laminating the thermoelectric elements 20 in this way, it is possible to simultaneously arrange the thermoelectric elements 20 on the sheet surface 12 of the base substrate 10 and thus reduce time required to arrange the thermoelectric elements 20, thereby enhancing productivity, as compared with when separately formed thermoelectric elements are individually bonded to the sheet surface 12 of the base substrate 10.

The length of the thermoelectric elements 20 and the interval between the thermoelectric elements 20 are not limited to a specific length. The length of the thermoelectric elements 20 and the interval between the thermoelectric elements 20 may be determined based on a thermal environment of the thermoelectric module sheet 1. Since the thermoelectric elements 20 are laminated on the sheet surface 12 as described above, the thermoelectric elements 20 may be supported by the sheet surface 12. Due to this, the thermoelectric elements 20 may have a structure robust to a mechanical vibration environment, compared to thermoelectric elements of a conventional thermoelectric module that are spaced apart from one another by a predetermined interval without the aid of a support member, such as the base substrate 10 of the thermoelectric module sheet 1. Accordingly, the thermoelectric elements 20 are less likely to short-circuit even though mechanical vibration is applied thereto, and therefore the thermoelectric elements 20 may be arranged with a narrower interval therebetween than the thermoelectric elements of the conventional thermoelectric module. As a result, the thermoelectric module sheet 1 may increase the density of the thermoelectric elements 20, compared to the conventional thermoelectric module.

Figure 4:
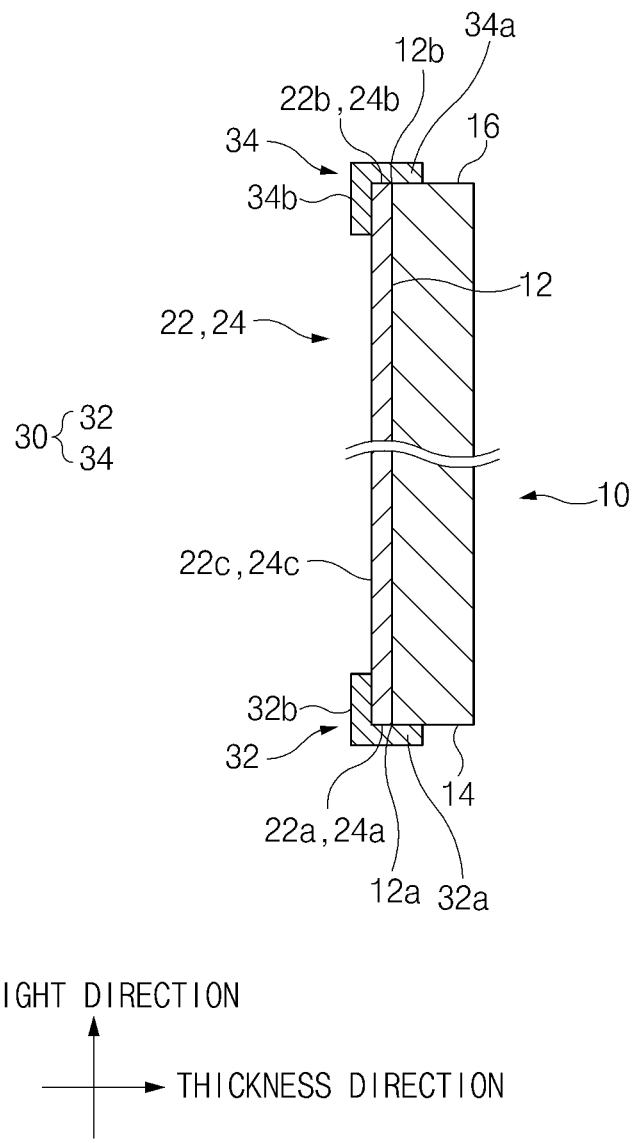
FIG. 4 is a side sectional view of the thermoelectric module sheet, which is taken along line I-I' of FIG. 1.

FIG. 4 is a side sectional view of the thermoelectric module sheet, which is taken along line I-I' of FIG. 1.

The electrodes 30 may be configured to electrically connect the thermoelectric elements 20 according to a predetermined connecting method. For example, the electrodes 30 may be configured to connect the thermoelectric elements 20 in series. To this end, as illustrated in FIG. 1, the electrodes 30 may include first electrodes 32 electrically connecting the heat source-side end surfaces 22a and 24a of the first thermoelectric elements 22 and the second thermoelectric elements 24 arranged adjacent to one another and second electrodes 34 electrically connecting the cold source-side end surfaces 22b and 24b of the first thermoelectric elements 22 and the second thermoelectric elements 24 arranged adjacent to one another.

The electrodes 30 may each have at least a portion located on the same straight line together with an end of the sheet surface 12 of the base substrate 10 or disposed to further protrude beyond the end of the sheet surface 12 of the base substrate 10 in a predetermined direction.

For example, as illustrated in FIGS. 3 and 4, in the case where the thermoelectric elements 20 are arranged such that the heat source-side end surfaces 22a and 24a of the thermoelectric elements 20 are located on the same straight line together with the one end 12a of the sheet surface 12 of the base substrate 10, the first electrodes 32 may each have at least a portion disposed to further protrude beyond the one end 12a of the sheet surface 12 of the base substrate 10 in one direction of the base substrate 10. To this end, the first electrodes 32 may each include a first part 32a laminated on any one thickness surface 14 of the base substrate 10 and the heat source-side end surface 22a, 24a of at least one of the thermoelectric elements 20 to further protrude beyond the one end 12a of the sheet surface 12 of the base substrate 10 in the one direction of the base substrate 10 and a second part 32b extending from the first part 32a to make a predetermined angle together with the first part 32a and having at least a portion laminated on a sheet surface 22c, 24c of at least one of the thermoelectric elements 20.

For instance, the one direction of the base substrate 10 may be the height direction of the base substrate 10 or the opposite direction to the height direction, and the thickness surface 14 of the base substrate 10 may be a thickness surface connected with the one end 12a of the sheet surface 12 of the base substrate 10, among the thickness surfaces of the base substrate 10. If the first electrodes 32 are laminated in this way, the first electrodes 32 may have an L-shaped section and may be disposed to make contact with the heat source-side end surfaces 22a and 24a and the sheet surfaces 22c and 24c of the thermoelectric elements 20, as illustrated in FIG. 4.

For example, as illustrated in FIGS. 3 and 4, in the case where the thermoelectric elements 20 are arranged such that the cold source-side end surfaces 22b and 24b of the thermoelectric elements 20 are located on the same straight line together with the opposite end 12b of the sheet surface 12 of the base substrate 10, the second electrodes 34 may each have at least a portion disposed to further protrude beyond the opposite end 12b of the sheet surface 12 of the base substrate 10 in an opposite direction of the base substrate 10. To this end, the second electrodes 34 may each include a first part 34a laminated on another thickness surface 16 of the base substrate 10 and the cold source-side end surface 22b, 24b of at least one of the thermoelectric elements 20 to further protrude beyond the opposite end 12b of the sheet surface 12 of the base substrate 10 in the opposite direction of the base substrate 10 and a second part 34b extending from the first part 34a to make a predetermined angle together with the first part 34a and having at least a portion laminated on the sheet surface 22c, 24c of at least one of the thermoelectric elements 20.

For instance, the opposite direction of the base substrate 10 may be the opposite direction to the one direction of the base substrate 10, which has been described above, and the other thickness surface 16 of the base substrate 10 may be a thickness surface connected with the opposite end 12b of the sheet surface 12 of the base substrate 10, among the thickness surfaces of the base substrate 10. If the second electrodes 34 are laminated in this way, the second electrodes 34 may have an L-shaped section and may be disposed to make contact with the cold source-side end surfaces 22b and 24b and the sheet surfaces 22c and 24c of the thermoelectric elements 20, as illustrated in FIG. 4.

If the first electrodes 32 and the second electrodes 34 are laminated as described above, the first electrodes 32 may make thermal contact with the heat source H, and the second electrodes 34 may make thermal contact with the cold source C, as illustrated in FIG. 1. Accordingly, the thermoelectric elements 20 may generate an electromotive force proportional to a temperature difference between the heat source-side end surfaces 22a and 24a making thermal contact with the heat source H through the first electrodes 32 and the cold source-side end surfaces 22b and 24b making thermal contact with the cold source C through the second electrodes 34.

The material of the electrodes 30 is not limited to a specific material. For example, the electrodes 30 may be formed of Cu, Al, Mo, Mo—Cu, Ni-coated Cu, or the like.

Meanwhile, the method for laminating the electrodes 30 on the base substrate 10 and the thermoelectric elements 20 is not limited to a specific technique. For example, the electrodes 30 may be laminated on the base substrate 10 and the thermoelectric elements 20 through plating.

Although it has been described that the first parts 32a of the first electrodes 32, which are laminated on the heat source-side end surfaces 22a and 24a of the thermoelectric elements 20, make contact with the heat source H, and the first parts 34a of the second electrodes 34, which are laminated on the cold source-side end surfaces 22b and 24b of the thermoelectric elements 20, make contact with the cold source C, the first electrodes 32 and the second electrodes 34 are not limited thereto. That is, the first electrodes 32 may include only the second parts 32b laminated on the sheet surfaces 22c and 24c of the thermoelectric elements 20 to allow the heat source-side end surfaces 22a and 24a of the thermoelectric elements 20 to make direct contact with the heat source H. Furthermore, the second electrodes 34 may include only the second parts 34b laminated on the sheet surfaces 22c and 24c of the thermoelectric elements 20 to allow the cold source-side end surfaces 22b and 24b of the thermoelectric elements 20 to make direct contact with the cold source C.

Figure 5:
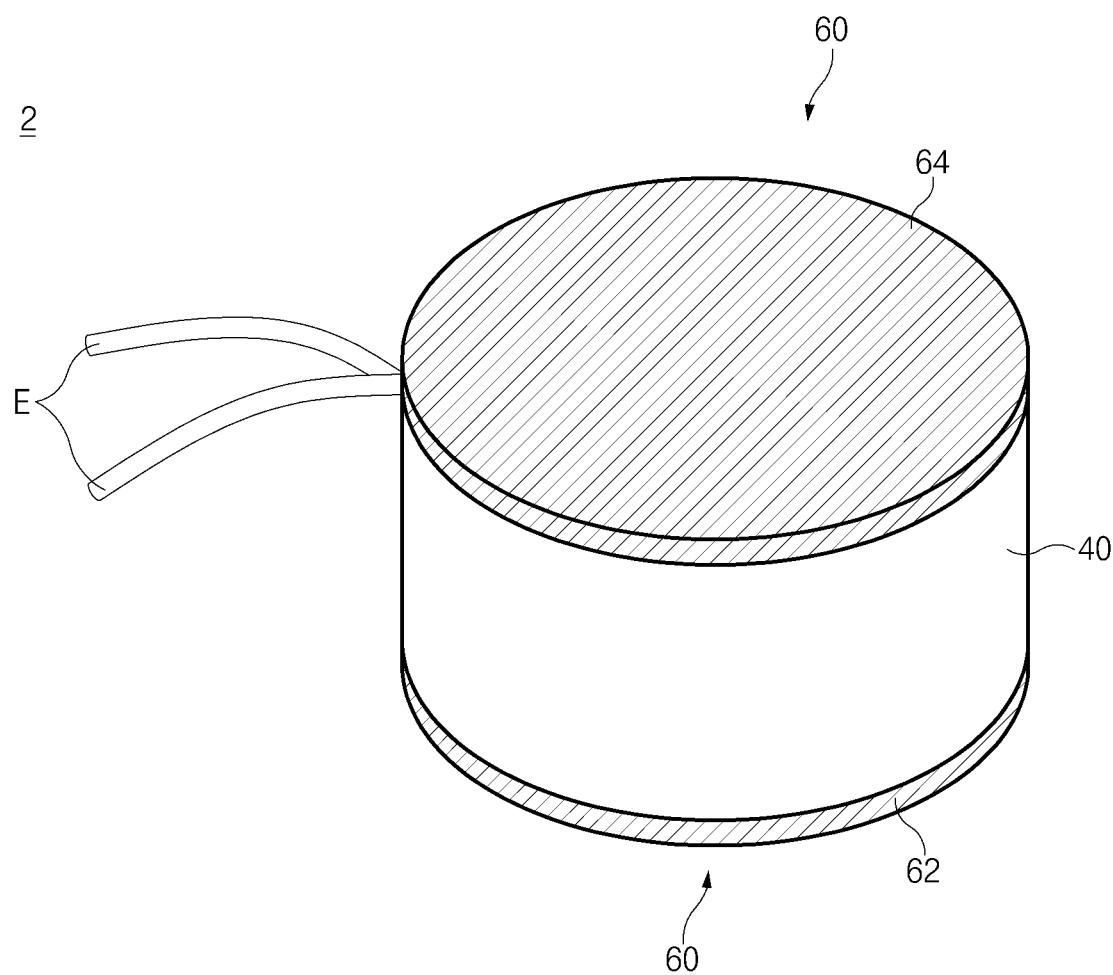
FIG. 5 is a perspective view of a thermoelectric module assembly according to a second embodiment of the present disclosure.
Figure 6:
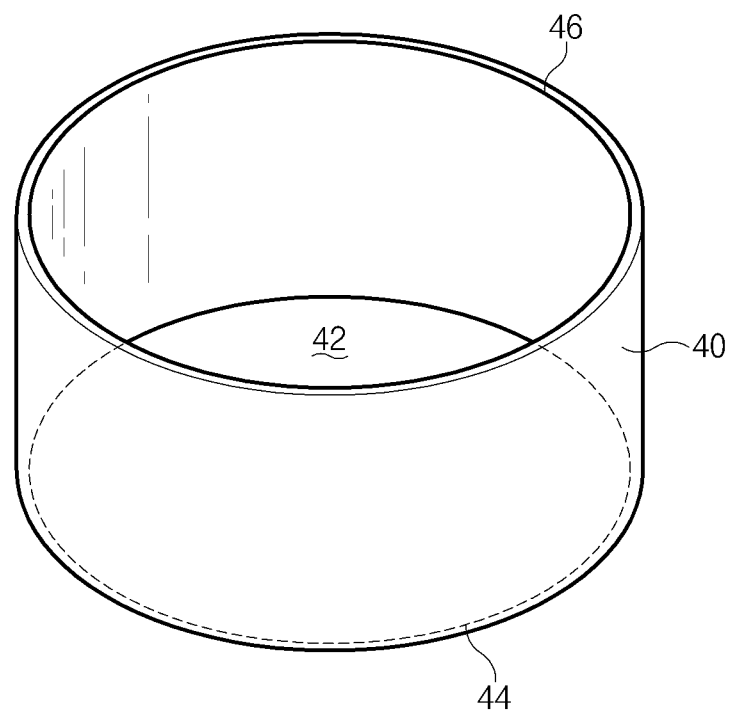
FIG. 6 is a perspective view of a housing.
Figure 7:
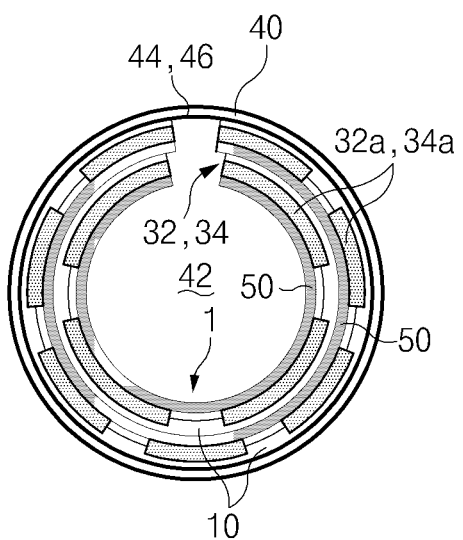
FIG. 7 is a plan view illustrating a state in which thermoelectric module sheets and insulation sheets are accommodated in the housing.

FIG. 5 is a perspective view of a thermoelectric module assembly according to a second embodiment of the present disclosure. FIG. 6 is a perspective view of a housing. FIG. 7 is a plan view illustrating a state in which thermoelectric module sheets and insulation sheets are accommodated in the housing.

Referring to FIGS. 5 to 7, a thermoelectric module assembly 2 according to the second embodiment of the present disclosure may include a housing 40, a plurality of thermoelectric module sheets 1 accommodated in the housing 40 and stacked in a predetermined stack direction, and insulation sheets 50 that cover the thermoelectric module sheets 1.

The housing 40 may have various shapes depending on the shape of an apparatus in which the thermoelectric module assembly 2 is mounted and other environmental conditions. For example, as illustrated in FIG. 6, the housing 40 may have a cylindrical shape. The housing 40 may have a storage space 42 formed therein to accommodate the thermoelectric module sheets 1 and the insulation sheets 50, a first opening 44 through which the storage space 42 is open in the direction toward the lower side of the base substrates 10 such that at least a part of the thermoelectric module sheets 1 is exposed to the outside, and a second opening 46 through which the storage space 42 is open in the direction toward the upper side of the base substrates 10 such that at least a part of the thermoelectric module sheets 1 is exposed to the outside.

The material of the housing 40 is not limited to a specific material. For example, the housing 40 may be formed of SUS, Al, or the like.

Figure 8:
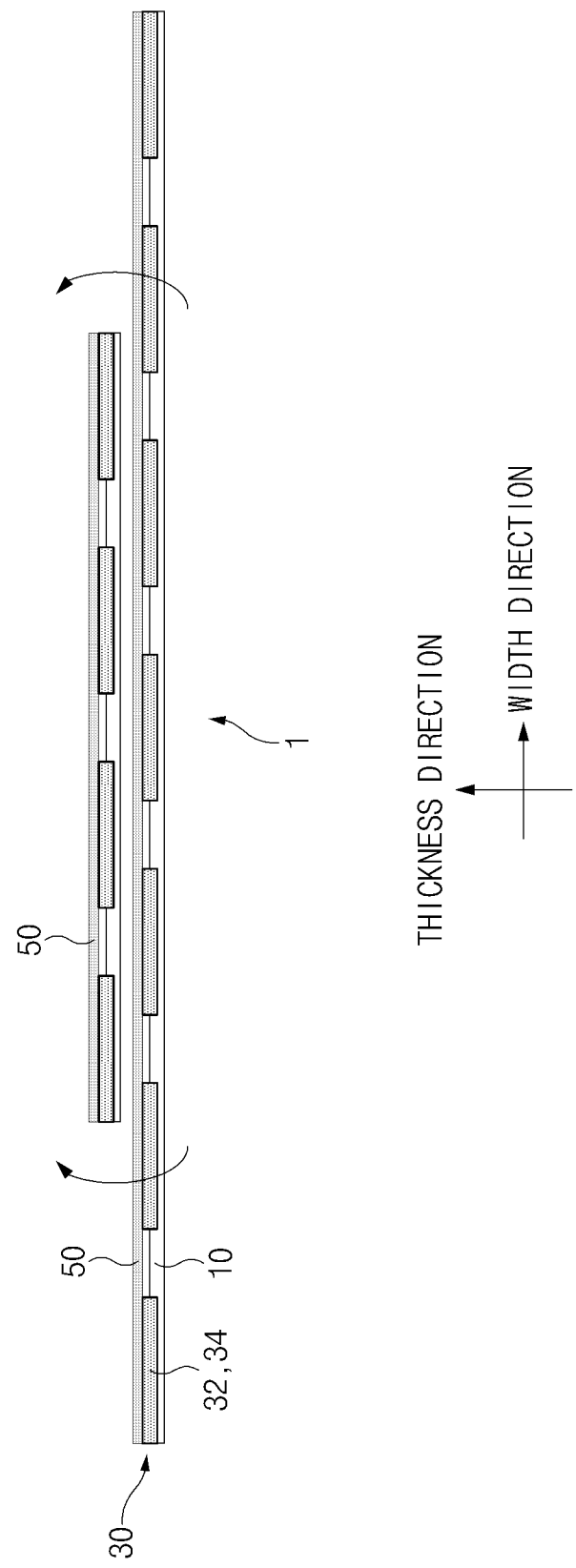
FIG. 8 is a schematic view for explaining a method for rolling the thermoelectric module sheets and insulation sheets.

FIG. 8 is a schematic view for explaining a method for rolling the thermoelectric module sheets and the insulation sheets.

The thermoelectric module sheets 1 may preferably have the same configuration as that of the above-described thermoelectric module sheet 1 according to the first embodiment of the present disclosure. As illustrated in FIG. 8, the thermoelectric module sheets 1 may be stacked in the thickness direction of the base substrates 10.

As illustrated in FIG. 8, each of the insulation sheets 50 may be installed to cover the thermoelectric elements 20 and the electrodes 30 of any one of thermoelectric module sheets 1 in the thickness direction of the corresponding base substrate 10. To this end, the insulation sheet 50 may have an area corresponding to the base substrate 10 of the thermoelectric module sheet 1 to cover the thermoelectric elements 20 and the electrodes 30 of the thermoelectric module sheet 1 in the thickness direction of the base substrate 10. Then, as illustrated in FIG. 8, the thermoelectric module sheets 1 and the insulation sheets 50 may be alternately stacked in the thickness direction of the base substrates 10.

The number of installed insulation sheets 50 is not limited to a specific figure, and the same number of insulation sheets 50 as the thermoelectric module sheets 1 may be installed. Similarly, the material of the insulation sheets 50 is not limited to a specific material. For example, the insulation sheets 50 may be formed of a flexible material based on an elastically-deformable polymer. The insulation sheets 50 may insulate the thermoelectric module sheets 1 to prevent short-circuits between the thermoelectric module sheets 1.

As illustrated in FIG. 8, the thermoelectric module sheets 1 and the insulation sheets 50 may be rolled about a predetermined center point by an external force to have a rounded shape. For example, as illustrated in FIG. 7, the thermoelectric module sheets 1 and the insulation sheets 50 may be rolled by an external force to have a cylindrical shape. In this case, the thermoelectric module sheets 1 and the insulation sheets 50 may preferably have different widths to have different radii when rolled. The thermoelectric module sheets 1 and the insulation sheets 50 rolled to have a cylindrical shape may be accommodated in the storage space 42 of the housing 40 through the openings 44 and 46 of the housing 40. Then, as illustrated in FIG. 7, the first parts 32a of the first electrodes 32 may be exposed outside the housing 40 through the first opening 44, and the first parts 34a of the second electrodes 34 may be exposed outside the housing 40 through the second opening 46.

Meanwhile, the thermoelectric module assembly 2 may further include insulation layers 60 stacked on the thermoelectric module sheets 1 in the height direction of the base substrates 10 or the opposite direction to the height direction to insulate at least a part of the thermoelectric module sheets 1 from outside the housing 40. As illustrated in FIG. 5, the insulation layers 60 may include a first insulation layer 62 stacked on a part of the thermoelectric module sheets 1 and the insulation sheets 50 exposed to the outside through the first opening 44 to at least cover the first parts 32a of the first electrodes 32 and a second insulation layer 64 stacked on a part of the thermoelectric module sheets 1 and the insulation sheets 50 exposed to the outside through the second opening 46 to at least cover the first parts 34a of the second electrodes 34.

The thermoelectric module assembly 2 may have an encapsulated structure in which the plurality of thermoelectric module sheets 1 are accommodated in the housing 40. Therefore, the thermoelectric module assembly 2 may stably maintain the thermoelectric module sheets 1, which have thermoelectric elements 20 laminated thereon, in an elastically deformed state according to the shape of the housing 40, and thus the thermoelectric elements 20 may be easily arranged in various forms depending on an apparatus in which the thermoelectric module assembly 2 is mounted and other environmental conditions. Furthermore, the thermoelectric module sheets 1 may be stacked so as to be brought into close contact with one another in the thickness direction of the base substrates 10, and thus the thermoelectric module assembly 2 may increase the density of the thermoelectric elements 20 to enhance thermoelectric energy conversion efficiency.

Meanwhile, unexplained reference number "E" denotes electric wires for electrically connecting the electrodes 30 with an external electric device, such as a battery.

Figure 9:
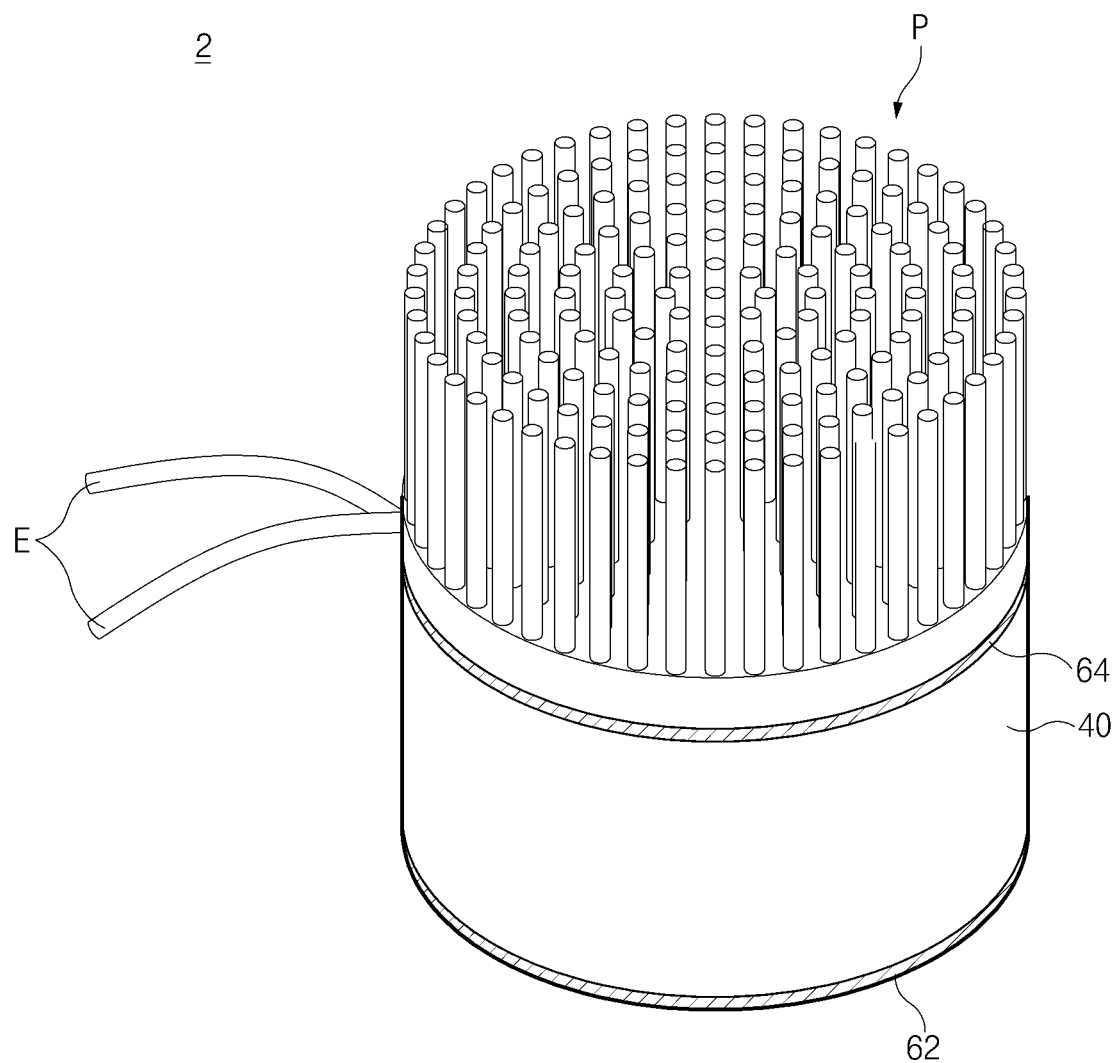
FIG. 9 is a perspective view illustrating a state in which cooling pins are stacked on the thermoelectric module assembly.
Figure 10:
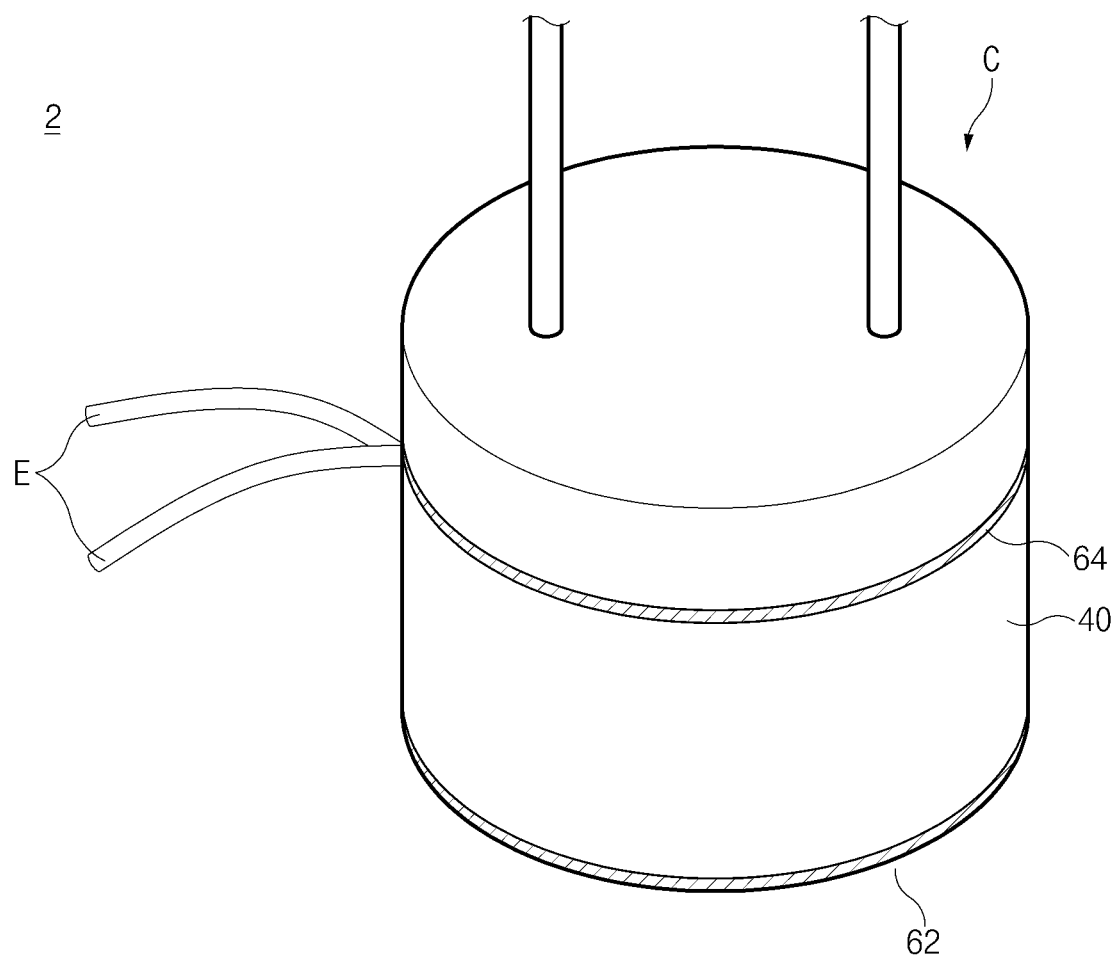
FIG. 10 is a perspective view illustrating a state in which a cooling jacket is stacked on the thermoelectric module assembly.

FIG. 9 is a perspective view illustrating a state in which heat dissipation pins are stacked on the thermoelectric module assembly. FIG. 10 is a perspective view illustrating a state in which a cooling jacket is stacked on the thermoelectric module assembly.

The thermoelectric module assembly 2 may be disposed such that the first insulation layer 62 makes thermal contact with the heat source H and the second insulation layer 64 makes thermal contact with the cold source C. Then, heat radiating from the heat source H may be transferred to the heat source-side end surfaces 22a and 24a of the thermoelectric elements 20 through the first insulation layer 62 and the first electrodes 32, and heat radiating from the cold source-side end surfaces 22b and 24b of the thermoelectric elements 20 may be transferred to the cold source C through the second electrodes 34 and the second insulation layer 64. The type of heat source H and cold source C applicable to the thermoelectric module assembly 2 is not limited to a specific source. For example, the heat source H may be an exhaust pipe, an exhaust manifold, or the like of a vehicle. For example, as illustrated in FIGS. 9 and 10, the cold source C may be heat dissipation pins P, a cooling jacket C, or the like.

Figure 11:
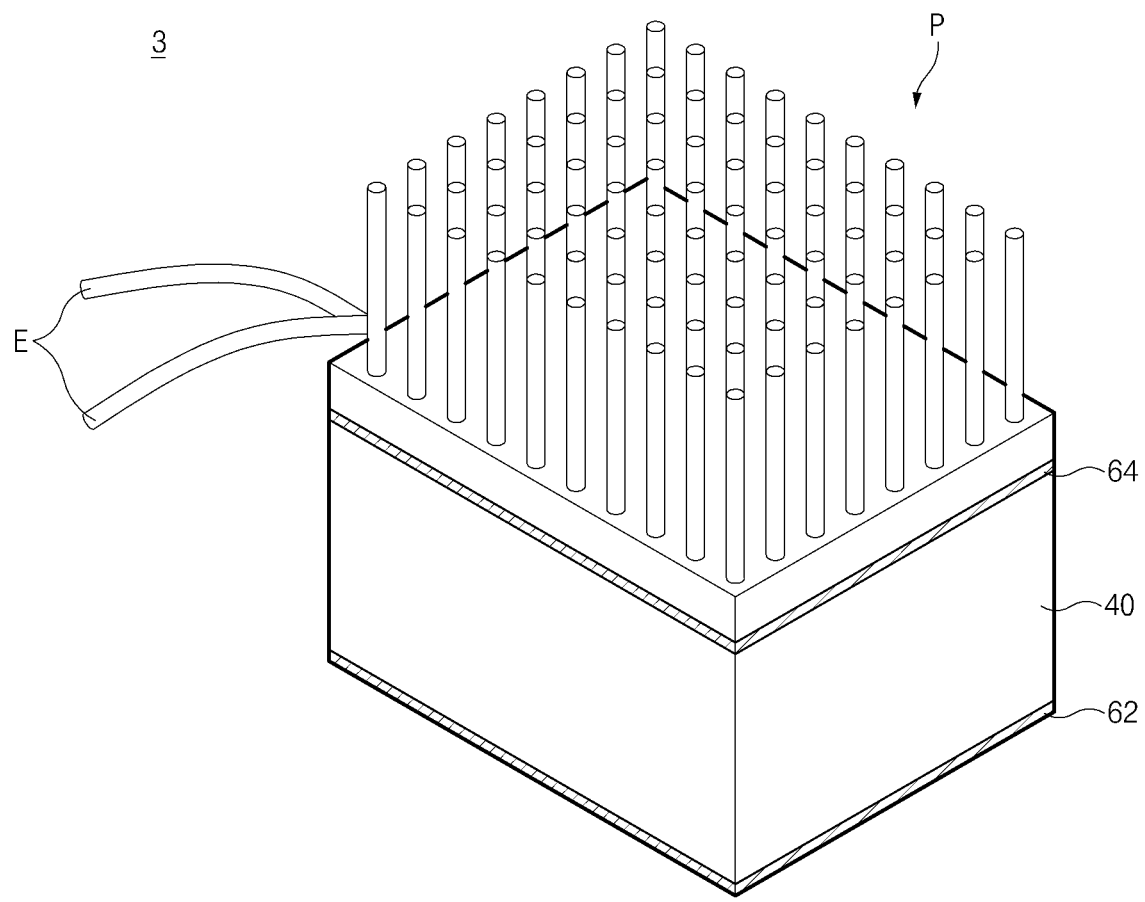
FIG. 11 is a perspective view of a thermoelectric module assembly according to a third embodiment of the present disclosure.
Figure 12:
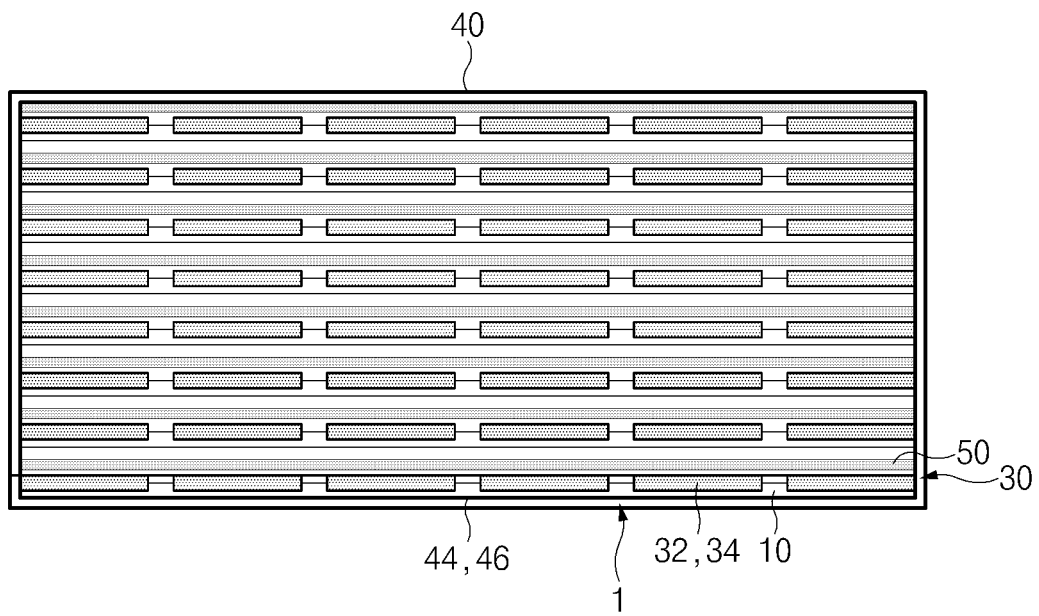
FIG. 12 is a plan view illustrating a state in which thermoelectric module sheets and insulation sheets are accommodated in a housing.
Figure 12:
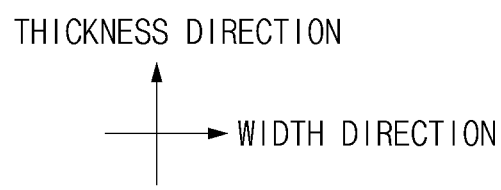

FIG. 11 is a perspective view of a thermoelectric module assembly according to a third embodiment of the present disclosure. FIG. 12 is a plan view illustrating a state in which thermoelectric module sheets and insulation sheets are accommodated in a housing. Referring to FIGS. 11 and 12, a thermoelectric module assembly 3 according to the third embodiment of the present disclosure differs from the above-described thermoelectric module assembly 2 in that the housing 40 has a rectangular parallelepiped shape and the thermoelectric module sheets 1 and the insulation sheets 50 are stacked to correspond to the shape of the housing 40.

As illustrated in FIG. 12, the thermoelectric module sheets 1 and the insulation sheets 50 may have the same area. The thermoelectric module sheets 1 and the insulation sheets 50 may be alternately stacked in the thickness direction of the base substrates 10 such that at least a part of the thermoelectric elements 20 and the electrodes 30 is covered by the insulation sheets 50. Then, the thermoelectric module sheets 1 and the insulation sheets 50 may form a rectangular parallelepiped. The thermoelectric module sheets 1 and the insulation sheets 50 stacked to form a rectangular parallelepiped may be accommodated in the storage space 42 of the housing 40.

Figure 13:
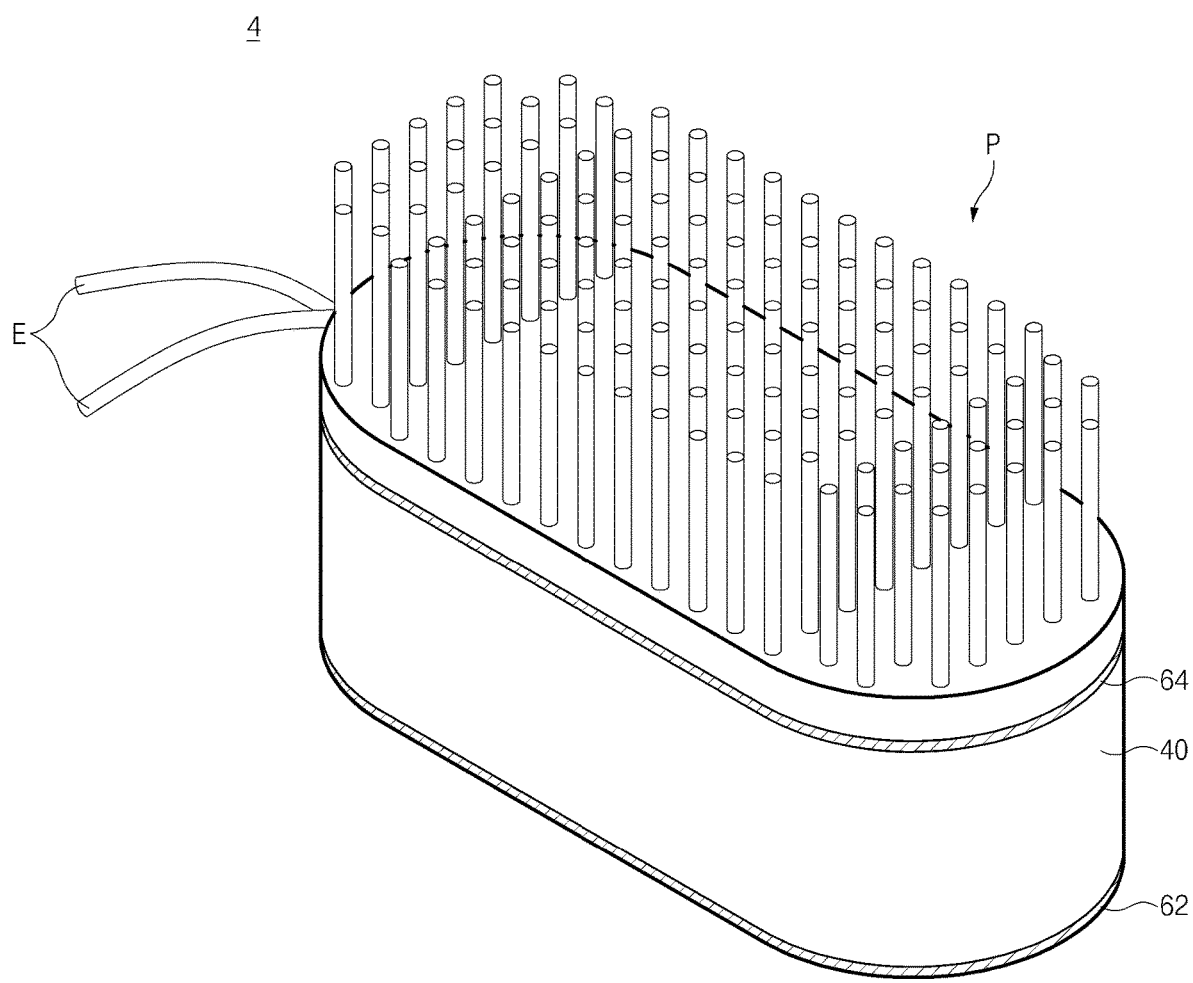
FIG. 13 is a perspective view of a thermoelectric module assembly according to a fourth embodiment of the present disclosure.
Figure 14:
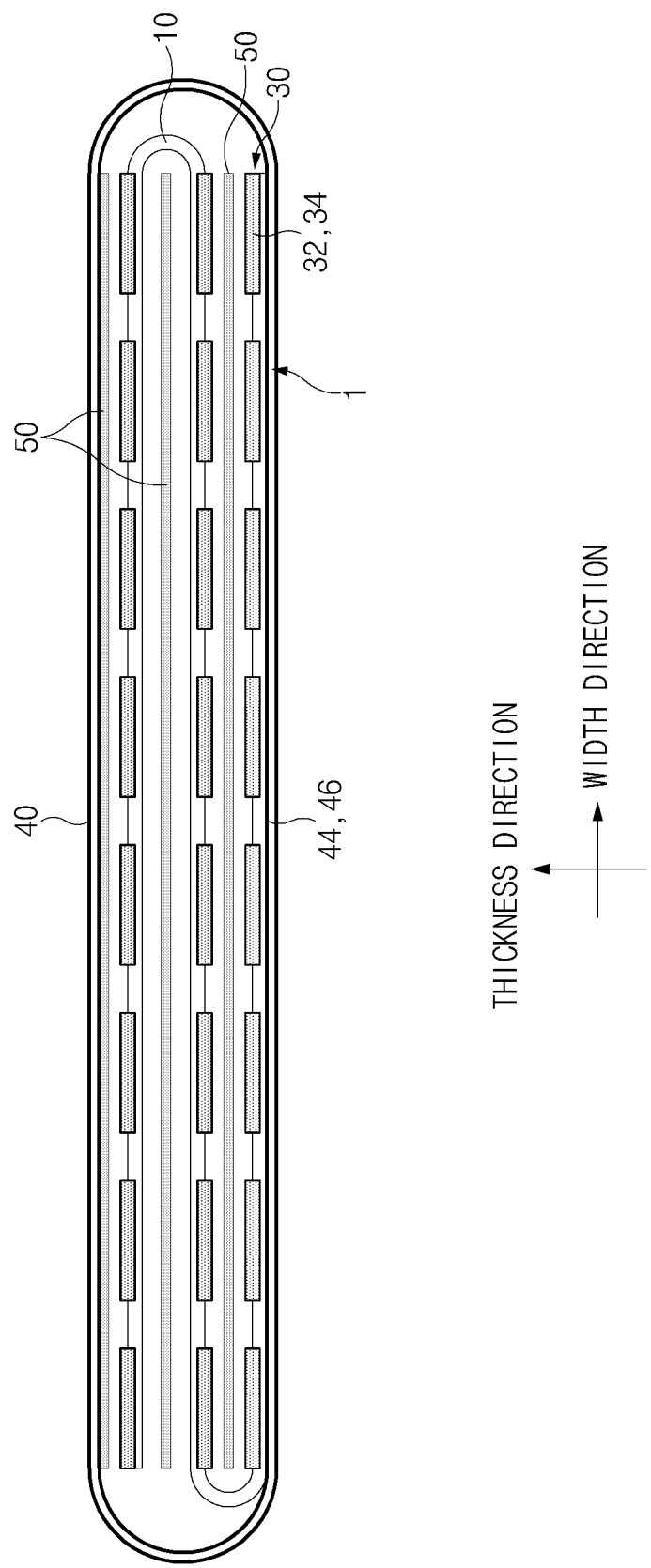
FIG. 14 is a plan view illustrating a state in which a thermoelectric module sheet and insulation sheets are accommodated in a housing.
Figure 15:
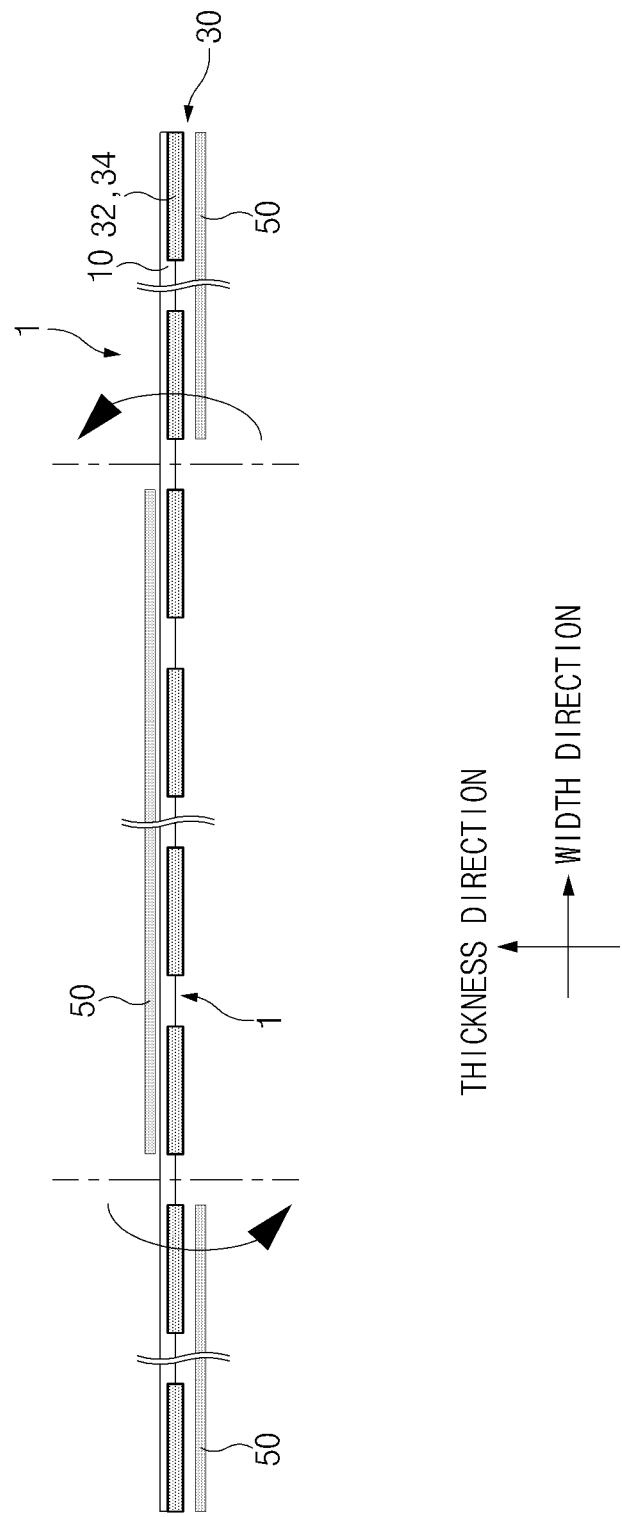
FIG. 15 is a schematic view for explaining a method for folding and stacking the thermoelectric module sheet and the insulation sheets.

FIG. 13 is a perspective view of a thermoelectric module assembly according to a fourth embodiment of the present disclosure. FIG. 14 is a plan view illustrating a state in which a thermoelectric module sheet and insulation sheets are accommodated in a housing. FIG. 15 is a schematic view for explaining a method for folding and stacking the thermoelectric module sheet and the insulation sheets.

Referring to FIGS. 13 and 14, a thermoelectric module assembly 4 according to the fourth embodiment of the present disclosure differs from the above-described thermoelectric module assembly 2 in that the housing 40 has a shape with rounded corners and the thermoelectric module sheet 1 and the insulation sheets 50 are folded and stacked to correspond to the shape of the housing 40.

As illustrated in FIG. 14, the base substrate 10 of the thermoelectric module sheet 1 may be folded at least once to have a multi-layer structure. The method for folding the base substrate 10 is not limited to a specific technique. For example, as illustrated in FIG. 15, the base substrate 10 may be folded in the predetermined clockwise or counterclockwise direction to form a multi-layer structure.

As illustrated in FIG. 14, the insulation sheets 50 may each be interposed between one layer of the base substrate 10 and another layer of the base substrate 10 that faces the one layer, to cover at least a part of the thermoelectric elements 20 and the electrodes 30 in the thickness direction of the base substrate 10. To this end, as illustrated in FIG. 15, the insulation sheets 50 may be stacked on one surface or an opposite surface of the thermoelectric module sheet 1 in consideration of the direction in which the base substrate 10 is folded. The thermoelectric module sheet 1 and the insulation sheets 50 folded and stacked to correspond to the shape of the housing 40 may be accommodated in the inner space of the housing 40.

Figure 16:
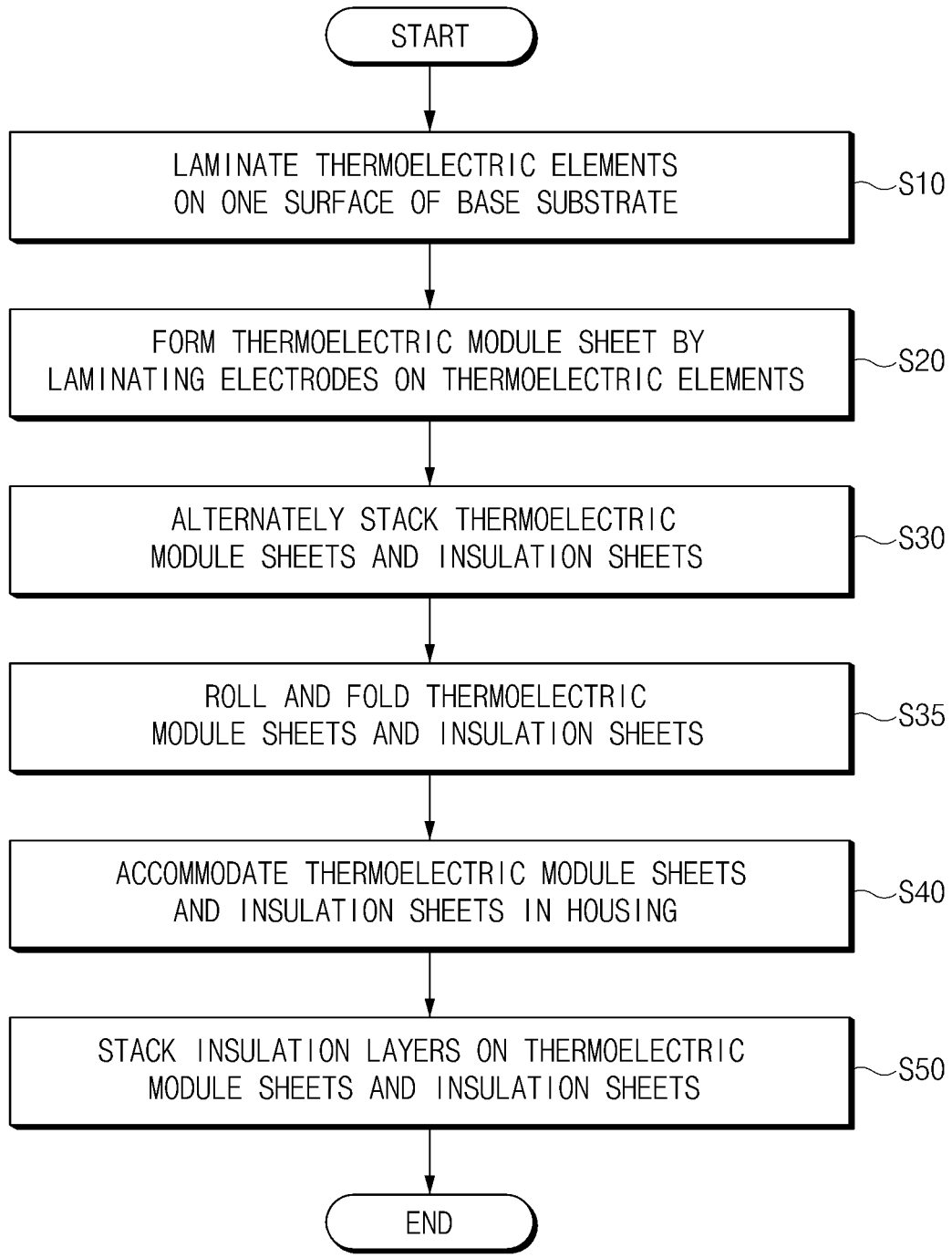
FIG. 16 is a flowchart for explaining a method for manufacturing a thermoelectric module assembly according to a fifth embodiment of the present disclosure.

FIG. 16 is a flowchart for explaining a method for manufacturing a thermoelectric module assembly according to a fifth embodiment of the present disclosure.

The method for manufacturing the thermoelectric module assembly according to the fifth embodiment of the present disclosure may include step S10 of laminating the thermoelectric elements 20 on one surface of the base substrate 10, step S20 of forming the thermoelectric module sheet 1 by laminating the electrodes 30 on at least one predetermined thermoelectric element 20 among the thermoelectric elements 20 such that the thermoelectric elements 20 are electrically connected together by a predetermined connecting method, step S30 of alternately stacking the thermoelectric module sheets 1 and the insulation sheets 50, and step S40 of accommodating the thermoelectric module sheets 1 and the insulation sheets 50 in the housing 40.

Step S10 may be performed by painting the thermoelectric elements 20 on the sheet surface 12 of the base substrate 10 such that the thermoelectric elements 20 having opposite polarities are alternately located on the sheet surface 12 of the base substrate 10 at a predetermined interval.

Step S20 may be performed by laminating the first electrodes 32 such that the heat source-side end surfaces 22a and 24a of the pair of thermoelectric elements 20 arranged adjacent to each other are electrically connected together, and then laminating the second electrodes 34 such that the cold source-side end surfaces 22b and 24b of the pair of thermoelectric elements 20 arranged adjacent to each other are electrically connected together. Each of the first electrodes 32 may preferably have at least a portion located on the same straight line together with the one end 12*a* of the sheet surface 12 of the base substrate 10 or laminated to further protrude beyond the one end 12*a* of the sheet surface 12 in one direction of the base substrate 10. Each of the second electrodes 34 may preferably have at least a portion located on the same straight line together with the opposite end 12*b* of the sheet surface 12 of the base substrate 10 or laminated to further protrude beyond the opposite end 12*b* of the sheet surface 12 in an opposite direction of the base substrate 10. If the electrodes 30 are laminated on the thermoelectric elements 20 as described above, the thermoelectric module sheet 1 having a structure in which the thermoelectric elements 20 and the electrodes 30 are laminated on the base substrate 10 may be formed. Here, the one direction of the base substrate 10 may preferably be the height direction of the base substrate 10 or the opposite direction to the height direction, and the opposite direction of the base substrate 10 may preferably be the opposite direction to the one direction of the base substrate 10.

Step S30 may be performed by alternately stacking the plurality of thermoelectric module sheets 1 and the plurality of insulation sheets 50 in the thickness direction of the base substrate 10 such that at least a part of the thermoelectric elements 20 and the electrodes 30 of each thermoelectric module sheet 1 is covered by any one of the insulation sheets 50 in the thickness direction of the base substrate 10.

Step S40 may be performed by accommodating the thermoelectric module sheets 1 and the insulation sheets 50 stacked in step S30 in the inner space of the housing 40. In this case, the thermoelectric module sheets 1 and the insulation sheets 50 may preferably be accommodated in the storage space 42 of the housing 40 such that at least a part of the electrodes 30 is exposed to the outside through the openings 44 and 46 of the housing 40. According to step S40, the plurality of thermoelectric module sheets 1 may be accommodated in the housing 40 to form an encapsulated thermoelectric module assembly.

The method for manufacturing the thermoelectric module assembly according to the fifth embodiment of the present disclosure may further include step S35 of rolling and folding the thermoelectric module sheets 1 and the insulation sheets 50 such that the thermoelectric module sheets 1 and the insulation sheets 50 have a shape corresponding to the housing 40, in which step S35 is performed between step S30 and step S40, and step S50 of insulating the thermoelectric module sheets 1 from the outside by stacking the insulation layers 60 on a part of the thermoelectric module sheets 1 and the insulation sheets 50 exposed to the outside through the openings 44 and 46 of the housing 40.

Although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure. Moreover, the embodiments described herein are not necessarily mutually exclusive of each other, whereby elements of each disclosed embodiment may be combined with other disclosed embodiments.

Therefore, exemplary embodiments of the present disclosure are provided to explain the spirit and scope of the present disclosure, but not to limit them, so that the spirit and scope of the present disclosure is not limited by the embodiments. The scope of the present disclosure should be construed on the basis of the accompanying claims, and all the technical ideas within the scope equivalent to the claims should be included in the scope of the present disclosure.

What is claimed is:

1. A thermoelectric module sheet comprising:
a base substrate having a sheet shape;
a plurality of thermoelectric elements laminated on a sheet surface of the base substrate, the sheet surface having a width and a height greater than a thickness of the base substrate; and
a plurality of electrodes, each of which is laminated on at least one surface of at least one of the plurality of thermoelectric elements to electrically connect the plurality of thermoelectric elements by a predetermined connecting method,
wherein the plurality of thermoelectric elements are arranged on the sheet surface such that a height direction of the plurality of thermoelectric elements is parallel to a height direction of the base substrate,
wherein the plurality of thermoelectric elements are spaced apart from each other in a width direction of the base substrate, and
wherein each of the plurality of electrodes includes:
a first part extending in a thickness direction of the base substrate and being in contact with a thickness surface of the base substrate; and
a second part extending from the first part in the height direction along a side end portion of the base substrate and a side end portion of the at least one of the plurality of thermoelectric elements so as to form an L-shaped section together with the first part, the L-shaped section being in contact with a plurality of surfaces of the at least one of the plurality of thermoelectric elements including a sheet surface of the at least one of the plurality of thermoelectric elements.

2. The thermoelectric module sheet of claim 1, wherein the base substrate is formed of an elastically deformable material.

3. A thermoelectric module assembly comprising:
a plurality of thermoelectric module sheets stacked in a predetermined stack direction; and
a plurality of insulation sheets, each of which covers one of the plurality of thermoelectric module sheets,
wherein each of the plurality of thermoelectric module sheets includes:
a base substrate having a sheet shape,
a plurality of thermoelectric elements arranged on a sheet surface of the base substrate, the sheet surface having a width and a height greater than a thickness of the base substrate, and
a plurality of electrodes configured to electrically connect the plurality of thermoelectric elements by a predetermined connecting method,
wherein the plurality of thermoelectric elements are arranged on the sheet surface such that a height direction of the plurality of thermoelectric elements is parallel to a height direction of the base substrate,
wherein the plurality of thermoelectric elements are spaced apart from each other in a width direction of the base substrate, and
wherein each of the plurality of electrodes includes:
a first part extending in a thickness direction of the base substrate and being in contact with a thickness surface of the base substrate; and
a second part extending from the first part in the height direction along a side end portion of the base substrate and a side end portion of at least one thermoelectric element of the plurality of thermoelectric elements so as to form an L-shaped section together with the first part, the L-shaped section being in contact with a plurality of surfaces of the at least one thermoelectric element including a sheet surface of the at least one thermoelectric element.

4. The thermoelectric module assembly of claim 3, wherein each of the plurality of insulation sheets is installed to cover at least a part of the plurality of thermoelectric elements and a part of the plurality of electrodes of a given thermoelectric module sheet in the stack direction.

5. The thermoelectric module assembly of claim 3, further comprising:
   a housing in which the plurality of thermoelectric module sheets and the plurality of insulation sheets are accommodated,
   wherein the housing has at least one opening through which at least a part of the plurality of thermoelectric module sheets is exposed to the outside.

6. The thermoelectric module assembly of claim 5, wherein the plurality of thermoelectric module sheets and the plurality of insulation sheets each have a rounded shape with a predetermined curvature.

7. The thermoelectric module assembly of claim 5, further comprising:
   an insulation layer stacked on the at least a part of the plurality of thermoelectric module sheets.

8. A thermoelectric module assembly comprising:
   at least one thermoelectric module sheet; and
   at least one insulation sheet stacked on the at least one thermoelectric module sheet,
   wherein the at least one thermoelectric module sheet includes:
      a base substrate folded to have a multi-layer structure, the base substrate having a sheet shape,
      a plurality of thermoelectric elements arranged on a sheet surface of the base substrate, the sheet surface having a width and a height greater than a thickness of the base substrate, and
      a plurality of electrodes configured to electrically connect the thermoelectric elements by a predetermined connecting method,
   wherein the at least one insulation sheet is interposed between one layer of the base substrate and another layer of the base substrate,
   wherein the plurality of thermoelectric elements are arranged on the sheet surface such that a height direction of the plurality of thermoelectric elements is parallel to a height direction of the base substrate,
   wherein the plurality of thermoelectric elements are spaced apart from each other in a width direction of the base substrate, and
   wherein each of the plurality of electrodes includes:
      a first part extending in a thickness direction of the base substrate and being in contact with a thickness surface of the base substrate; and
      a second part extending from the first part in the height direction along a side end portion of the base substrate and a side end portion of at least one thermoelectric element of the plurality of thermoelectric elements so as to form an L-shaped section together with the first part, the L-shaped section being in contact with a plurality of surfaces of the at least one thermoelectric element including a sheet surface of the at least one thermoelectric element.

9. The thermoelectric module assembly of claim 8, further comprising:
   a housing in which the at least one thermoelectric module sheet and the at least one insulation sheet are accommodated,
   wherein the housing has at least one opening through which at least a part of the at least one thermoelectric module sheet is exposed to the outside.

10. The thermoelectric module assembly of claim 9, further comprising:
   an insulation layer stacked on the at least a part of the at least one thermoelectric module sheet.

* * * * *